US010424256B2

(12) United States Patent
Sung et al.

(10) Patent No.: US 10,424,256 B2
(45) Date of Patent: Sep. 24, 2019

(54) DISPLAY DEVICE, GATE DRIVING CIRCUIT, AND DRIVING METHOD THEREOF

(71) Applicant: LG Display Co., Ltd., Seoul (KR)

(72) Inventors: Kiyoung Sung, Seoul (KR); SangHoon Jung, Gyeonggi-do (KR); HeeYoung An, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 101 days.

(21) Appl. No.: 15/389,669

(22) Filed: Dec. 23, 2016

(65) Prior Publication Data

US 2017/0193921 A1 Jul. 6, 2017

(30) Foreign Application Priority Data

Dec. 31, 2015 (KR) ........................ 10-2015-0190902

(51) Int. Cl.
*G09G 3/3291* (2016.01)
*G09G 3/3258* (2016.01)
(Continued)

(52) U.S. Cl.
CPC ......... *G09G 3/3291* (2013.01); *G09G 3/3233* (2013.01); *G09G 3/3258* (2013.01);
(Continued)

(58) Field of Classification Search
CPC .. G09G 3/3674; G09G 3/3677; G09G 3/3266; G09G 3/3233; G09G 3/3225; G09G 2310/0286
See application file for complete search history.

(56) References Cited

U.S. PATENT DOCUMENTS

2009/0225068 A1 9/2009 Jeong et al.
2011/0273418 A1* 11/2011 Park .................... G09G 3/3208
345/211

(Continued)

FOREIGN PATENT DOCUMENTS

CN 102270434 A 12/2011
CN 103996367 A 8/2014
(Continued)

OTHER PUBLICATIONS

Extended European Search Report dated Apr. 4, 2017, for the corresponding European Patent Application No. 16205877.
(Continued)

*Primary Examiner* — Yuzhen Shen
(74) *Attorney, Agent, or Firm* — Morgan, Lewis & Bockius LLP

(57) ABSTRACT

Provided are a display device, gate driving circuit, and a driving method thereof. A display device includes: a display panel including a plurality of pixel areas, a gate driving unit configured to supply an emission signal to each of the plurality of pixel areas through switching of a driving TFT by inverting an input signal, the gate driving unit including an emission boosting capacitor configured to periodically boost a voltage applied to a gate node of the driving TFT, a data driving unit configured to supply a data signal to each of the plurality of pixel areas, and a timing control unit configured to: supply a gate control signal to the gate driving unit, and supply a data control signal and image data to the data driving unit.

13 Claims, 14 Drawing Sheets

(51) Int. Cl.
*G09G 3/3233* (2016.01)
*G09G 3/3266* (2016.01)

(52) U.S. Cl.
CPC ... *G09G 3/3266* (2013.01); *G09G 2300/0842* (2013.01); *G09G 2300/0861* (2013.01); *G09G 2310/0286* (2013.01); *G09G 2310/08* (2013.01)

(56) References Cited

U.S. PATENT DOCUMENTS

2011/0298771 A1 12/2011 Yoo et al.
2012/0098826 A1 4/2012 Lee et al.
2012/0176417 A1 7/2012 Jang et al.
2013/0222352 A1* 8/2013 Jeong .................. G09G 3/3266 345/205
2014/0035041 A1 2/2014 Pillarisetty et al.
2014/0071114 A1* 3/2014 Kim ....................... G11C 19/28 345/212
2014/0111403 A1 4/2014 Kim et al.
2014/0368414 A1* 12/2014 Kim ..................... G09G 3/3266 345/77
2015/0109276 A1 4/2015 Gupta et al.
2015/0109279 A1* 4/2015 Gupta .................. G09G 3/3233 345/211
2015/0138180 A1 5/2015 Park et al.
2015/0302934 A1* 10/2015 Qi ........................ G11C 19/184 377/54
2017/0018243 A1* 1/2017 Huang ..................... G09G 3/36
2017/0316740 A1* 11/2017 Yang ..................... G06F 3/0412

FOREIGN PATENT DOCUMENTS

CN 104103244 A 10/2014
CN 104170091 A 11/2014
CN 104599620 A 5/2015
CN 104700803 A 6/2015
JP 2014-157638 A 8/2014
KR 10-2012-0061146 A 6/2012
KR 10-2015-0028403 A 3/2015
KR 10-2015-0069773 A 6/2015

OTHER PUBLICATIONS

Japanese Office Action dated Dec. 5, 2017, issued in corresponding Japanese Application No. 2016-241868.
Taiwan Office Action dated Oct. 25, 2017, issued in corresponding Taiwanese Application No. 105141452.
Chinese Office Action dated Sep. 5, 2018, issued in corresponding Chinese Application No. 201611247952.9.

* cited by examiner

DISPLAY DEVICE, GATE DRIVING CIRCUIT, AND DRIVING METHOD THEREOF

CROSS-REFERENCE TO RELATED APPLICATION(S)

This application claims the benefit of Korean Patent Application No. 10-2015-0190902, filed on Dec. 31, 2015, the entire disclosure of which is hereby incorporated by reference herein.

BACKGROUND

1. Technical Field

The present disclosure relates to a display device, and more particularly, to a gate driving circuit for a display device and a driving method thereof.

2. Discussion of the Related Art

Organic light-emitting diode (OLED) display devices, which are one type of flat display devices (FPDs), have high luminance and a low operating voltage. An OLED display device, which is a self-luminous type, has a high contrast ratio, can be manufactured as an ultrathin display device, has a fast response time of about several microseconds (μs) enabling smooth reproduction of a moving picture, has a wide viewing angle, is stable at low temperature, and is operable at a low voltage of 5V to 15V DC. Thus, it is easy to manufacture and design a driving circuit for the OLED display device.

Furthermore, because deposition and encapsulation processes encompass most of a manufacturing process of an OLED display device, the manufacturing process is very simple. Such an OLED display device is described below with reference to the accompanying drawings.

FIG. 1 illustrates an organic light-emitting diode (OLED) display device according to the related art.

As illustrated in FIG. 1, an OLED display device 10 may include a display panel 20 for displaying an image, a gate driving unit 30 for supplying a gate signal, a data driving unit 40 for supplying a data signal, and a timing control unit 50 for supplying a gate control signal GCS, a data control signal DCS, and image data RGB.

The display panel 20 may include a plurality of gate lines GL1 to GLm, a plurality of data lines DL1 to DLn, and a plurality of power lines PL1 to PLn, which are formed on a substrate (not shown). The gate lines GL1 to GLm, the data lines DL1 to DLn, and the power lines PL1 to PLn cross one another, forming a pixel area P. Each pixel area P is provided with a switching thin film transistor (TFT) Ts connected to the gate lines GL1 to GLm and the data lines DL1 to DLn, a driving TFT Td and a storage capacitor Cs connected to a switching TFT Ts, and a light-emitting diode De connected to the driving TFT Td.

The gate driving unit 30 generates a gate signal by using the gate control signal GCS transmitted by the timing control unit 50, and transmits a generated gate signal to the gate lines GL1 to GLm of the display panel 20. The data driving unit 40 generates a data signal by using the data control signal DCS and the image data RGB transmitted by the timing control unit 50, and transmits a generated data signal to the data lines DL1 to DLn of the display panel 20. A power supply unit (not shown) supplies a power voltage to the power lines PL1 to PLn via the data driving unit 40.

The timing control unit 50 generates the gate control signal GCS, the data control signal DCS, and the image data RGB by using an image signal IS, a data enable signal DE, a horizontal sync signal HSY, a vertical sync signal VSY, and a clock signal CLK, which are input from an external system.

In the OLED display device 10 configured as above, when the switching TFT Ts is turned on in response to the gate signal applied via the gate lines GL1 to GLm, the data signal applied via the data lines DL1 to DLn is applied to the driving TFT Td via the switching TFT Ts. Thus, the driving TFT Td is turned on. A current applied via the power lines PL1 to PLn is applied to the light-emitting diode De via the driving TFT Td, thereby enabling display of a grayscale level.

The display panel 20 may further include a plurality of compensation elements (not shown) to compensate for a change in a threshold voltage Vth of the driving TFT Td. The gate driving unit 30 may include a shift register for generating a gate signal to sequentially turn the switching TFTs Ts on and an inverter for generating an emission signal to control the compensation elements. However, in the shift register and the inverter, many TFTs are under high junction stress. That is, TFTs are kept turned off because a high voltage is applied between a drain and a source in most of one (1) frame that is a unit of image display. A TFT under high junction stress may have a malfunction, such as drain-induced barrier lowering (DIBL), which is described below with reference to the accompany drawings FIG. 2 illustrates that a drain-source voltage is not applied to a TFT of a gate driving unit of the OLED display device of FIG. 1. FIG. 3 illustrates that the drain-source voltage is applied to the TFT of the gate driving unit of the OLED display device of FIG. 1. FIG. 4 is a graph showing the electrical properties of the TFT of the gate driving unit of the OLED display device of FIG. 1.

With reference to FIG. 2, in a TFT including a gate G, a drain D, and a source S, when the drain-source voltage Vds is not applied between the drain D and the source S, a depletion region DR is formed by the gate G, the drain D, and the source S, and electrons of the source S are not transferred to the drain D so that no current flows in the TFT.

With reference to FIG. 3, when the drain-source voltage Vds, which is a relatively high voltage, is applied between the source S and the drain D, the depletion region DR by the drain D extends in a direction toward the source S. Thus, the height of a potential barrier of elements is lowered. Accordingly, some electrons of the source S are transferred to the drain D. Thus, a current flows in the TFT.

The above phenomenon is referred to as the drain-induced barrier lowering. The drain-induced barrier lowering becomes severe as a length L of a channel of the TFT deceases and the voltage of the drain D increases.

The drain-induced barrier lowering may be represented by a change in the threshold voltage Vth of the TFT. For example, in a positive type (p-type) TFT, as the drain-source voltage Vds increases, the threshold voltage Vth moves in a positive direction of a gate-source voltage Vgs, thereby increasing an off-current.

In other words, with reference to FIG. 4, as the drain-source voltage Vds increases from about −0.1V to about −10.1V and about −20.1V, the threshold voltage Vth moves in the positive direction of the gate-source voltage Vgs. As a result, when the gate-source voltage Vgs is about 0V, the drain-source current Ids of the TFT is changed from about 10 fA ($1\times10^{-14}$ A) to about 1 pA ($1\times10^{-12}$ A) and about 10 nA ($1\times10^{-8}$ A) and thus the off-current at which the TFT is turned off increases. The increase in the off-current of the TFT causes a malfunction of the gate driving unit 30. Such a problem may be more severe in a gate-in-panel (GIP) type flexible OLED display device that has been recently introduced.

In the gate-in-panel type OLED display device, a plurality of TFTs constituting a gate driving unit are manufactured by the same process of manufacturing the switching TFT Ts and the driving TFT Td of the display panel 20. Thus, the gate driving unit is formed on a substrate of a display panel. A flexible substrate is used in a flexible OLED display device for a thin and light display device. For example, the flexible substrate is formed of a polymer material, such as polyimide (PI).

Accordingly, in the gate-in-panel type flexible OLED display device, the TFT constituting the gate driving unit is formed on the flexible substrate. Because the thermal diffusivity of polyimide (about 0.08 $mm^2/s$) is much lower than the thermal diffusivity of glass (0.34 $mm^2/s$), the heat sinking properties of the flexible substrate is much lower than those of a glass substrate. Accordingly, in the TFT on the flexible substrate, joule heat according to repeated operations of turning-on/turning-off is not dissipated, and the drain-induced barrier lowering is more severe.

The malfunction of the TFT of the shift register of the gate driving unit increases a diode current flowing in a light-emitting diode by turning on a plurality of switching TFTs by outputting a plurality of gate signals, or by turning on a plurality of sampling transistors by outputting a plurality of sampling signals. As a result, a defect occurs, such as a whitening phenomenon, i.e., luminance of a part of the display panel 20 increases.

The malfunction of the TFT of the inverter of the gate driving unit increases a voltage level of the emission signal so that an amount of the turn-on of a light-emitting transistor is reduced. Accordingly, the diode current flowing in the light-emitting diode is reduced. Thus, a defect occurs, such as an irregular horizontal line pattern, i.e., horizontal pixel lines of the display panel 20 are irregularly darkened.

FIG. 5 is a graph showing the electrical properties of an emission Q node of an inverter unit of the OLED display device of FIG. 1.

With reference to FIG. 5, as a current leakage occurred in the TFT in a high temperature reliability environment, a voltage of the emission Q node of the inverter unit gradually drops to 12V as time passes. The voltage drop of the emission Q node may be generated, not only in the high temperature reliability environment, but also by degradation of the TFT. The Q node denotes a gate node of the driving TFT.

FIG. 6 is a graph showing the electrical properties of an output voltage of the inverter unit of the OLED display device of FIG. 1.

With reference to FIG. 6, as the voltage of the emission Q node of the inverter unit drops to 12V, the emission output voltage of the inverter unit reaches 12V. Accordingly, because an amount of the turn-on of a light-emitting transistor is reduced according to a decrease in the emission output voltage, the diode current flowing in the light-emitting diode decreases. Thus, a defect occurs, such as an irregular horizontal line pattern, i.e., horizontal pixel lines of the display panel 20 are irregularly darkened.

SUMMARY

Accordingly, the present disclosure is directed to a display device, gate driving circuit, and a driving method thereof that substantially obviate one or more of the problems due to limitations and disadvantages of the related art.

An object of the present disclosure is to provide a display device in which a voltage of a gate node of a driving TFT of a gate driving circuit provided in the display device is periodically boosted so that an emission output voltage of an inverter is not lowered, even when a current leakage occurs due to degradation of the TFT under a high temperature environment, and to provide a gate driving circuit, and a driving method thereof.

Additional features and advantages will be set forth in the description that follows, and in part will be apparent from the description, or may be learned by practice of the invention. The objectives and other advantages of the disclosure will be realized and attained by the structure particularly pointed out in the written description and claims thereof as well as the appended drawings.

To achieve these and other advantages and in accordance with the purpose of the present disclosure, as embodied and broadly described, there is provided a display device, including: a display panel including a plurality of pixel areas, a gate driving unit configured to supply an emission signal to each of the plurality of pixel areas through switching of a driving TFT by inverting an input signal, the gate driving unit including an emission boosting capacitor configured to periodically boost a voltage applied to a gate node of the driving TFT, a data driving unit configured to supply a data signal to each of the plurality of pixel areas, and a timing control unit configured to: supply a gate control signal to the gate driving unit, and supply a data control signal and image data to the data driving unit.

In another aspect, there is provided a gate driving circuit for supplying an emission signal to each of a plurality of pixel areas provided in a display device, the gate driving circuit including: a driving TFT configured to output a power voltage or a base voltage as the emission signal to each of the plurality of pixel areas by inverting an input signal, a plurality of switching TFTs configured to control turn-on or turn-off of the driving TFT, and an emission boosting capacitor configured to periodically boost a voltage applied to a gate node of the driving TFT.

In another aspect, there is provided a method of driving a display device including a gate driving circuit connected to a gate node of a driving TFT, the gate driving circuit including an emission boosting capacitor that is electrically floated, the method including: boosting a voltage of a gate node of the driving TFT by applying a boosting clock signal to the emission boosting capacitor, outputting a power voltage or a base voltage as an emission signal through the driving TFT by controlling a plurality of switching TFTs by applying an emission clock signal, and supplying an output emission signal to each of a plurality of pixel areas provided in the display device.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments of the disclosure. It is to be understood that both the foregoing general description and the following detailed description of the present disclosure are examples and explanatory, and are intended to provide further explanation of the disclosure as claimed.

BRIEF DESCRIPTION OF THE DRAWINGS

The accompanying drawings, which are included to provide a further understanding of the invention and are incorporated in and constitute a part of this specification, illustrate implementations of the invention and together with the description serve to explain the principles of the disclosure.

Figure 1:
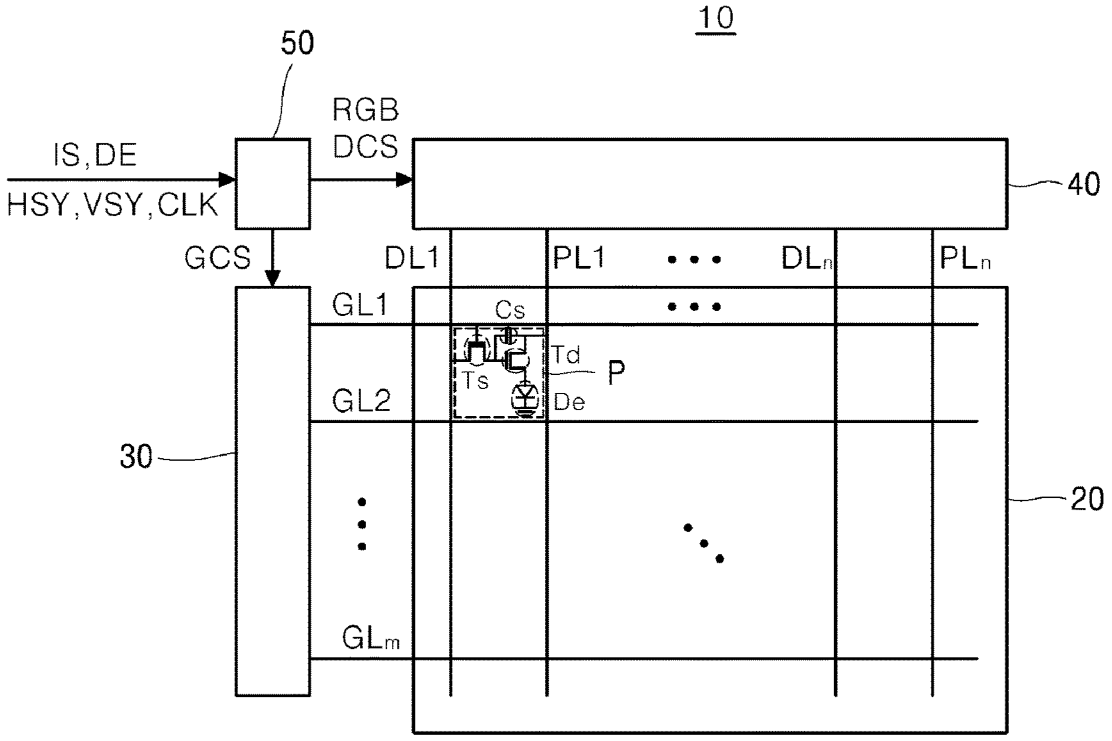
FIG. 1 (Related Art)
FIG. 1 illustrates an organic light-emitting diode (OLED) display device according to the related art.
Figure 2:
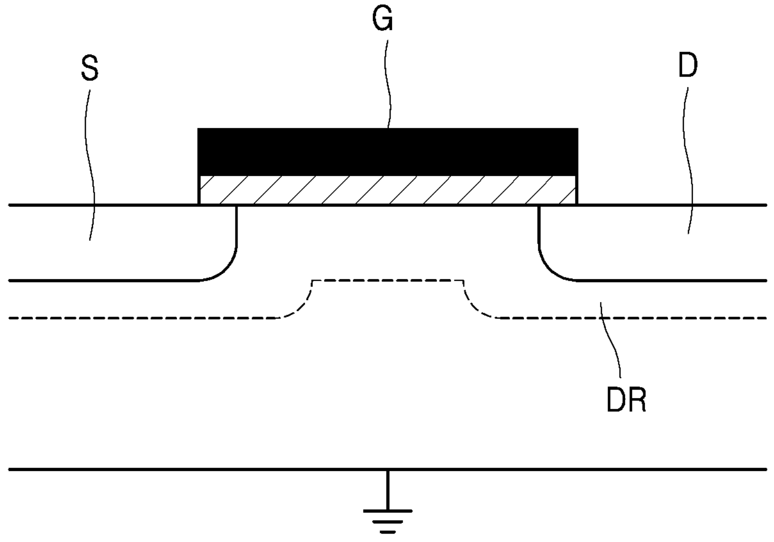
FIG. 2 (Related Art)
FIG. 2 illustrates that a drain-source voltage is not applied to a TFT of a gate driving unit of the OLED display device of FIG. 1.
Figure 3:
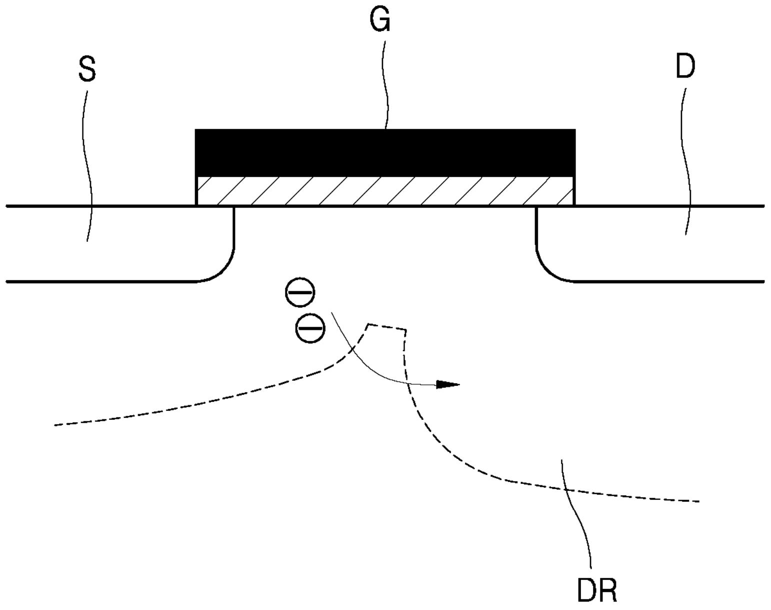
FIG. 3 (Related Art)
FIG. 3 illustrates that the drain-source voltage is applied to the TFT of the gate driving unit of the OLED display device of FIG. 1.
Figure 4:
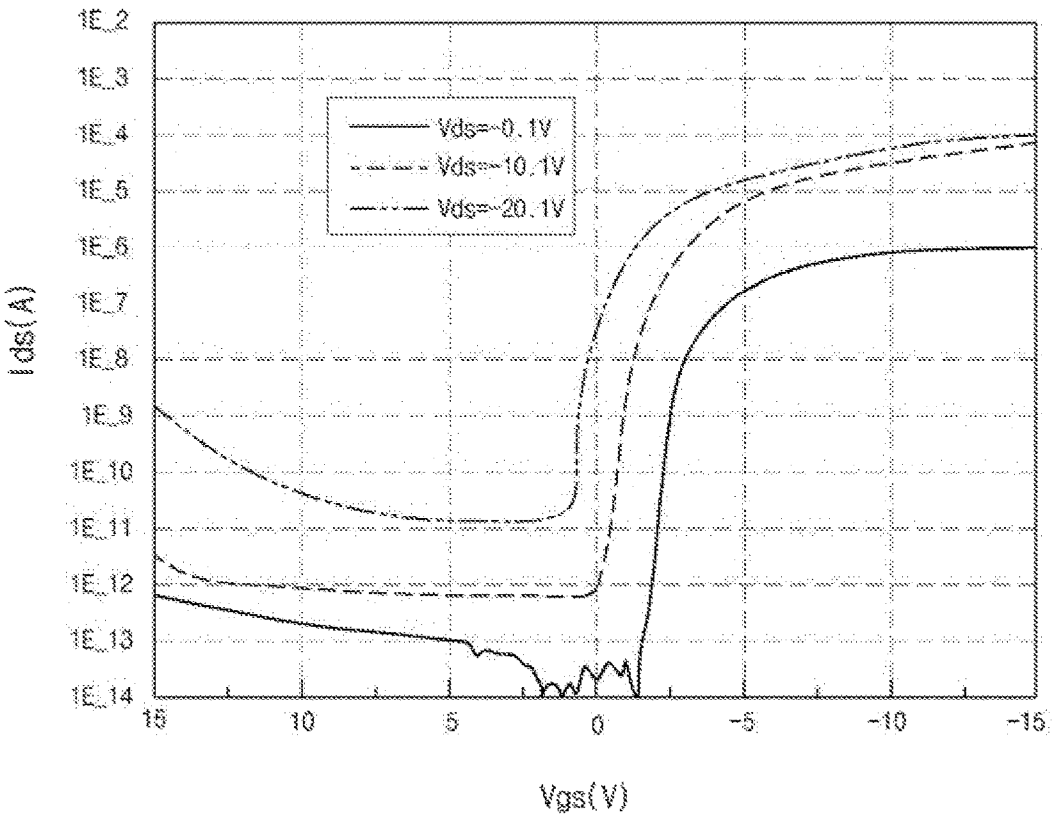
FIG. 4 (Related Art)
FIG. 4 is a graph showing the electrical properties of the TFT of the gate driving unit of the OLED display device of FIG. 1.
Figure 5:
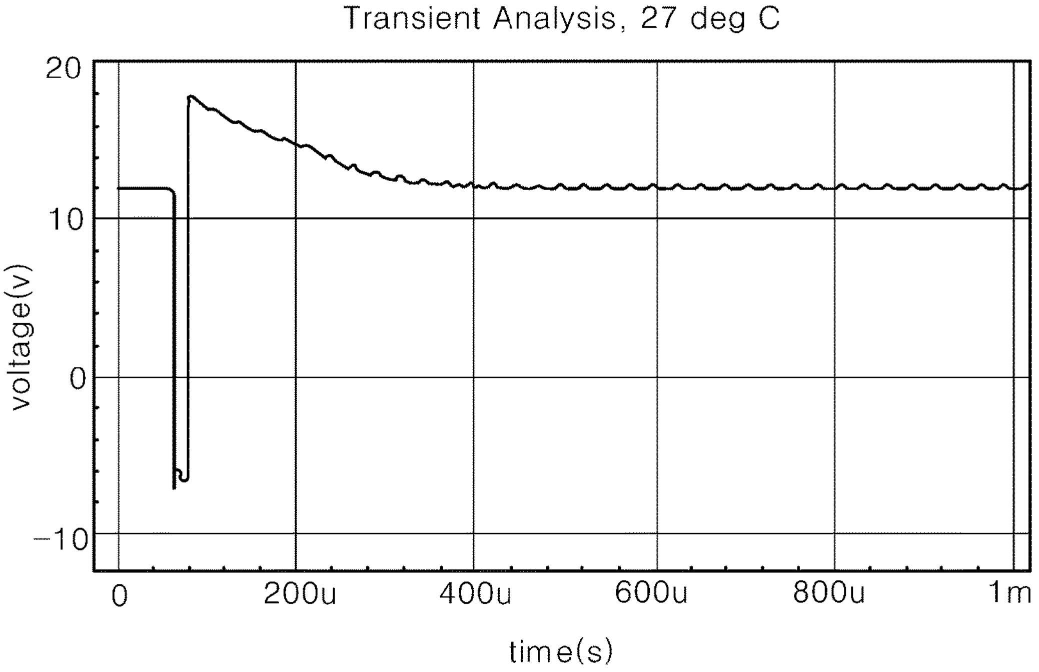
FIG. 5 (Related Art)
FIG. 5 is a graph showing the electrical properties of an emission Q node of an inverter unit of the OLED display device of FIG. 1.
Figure 6:
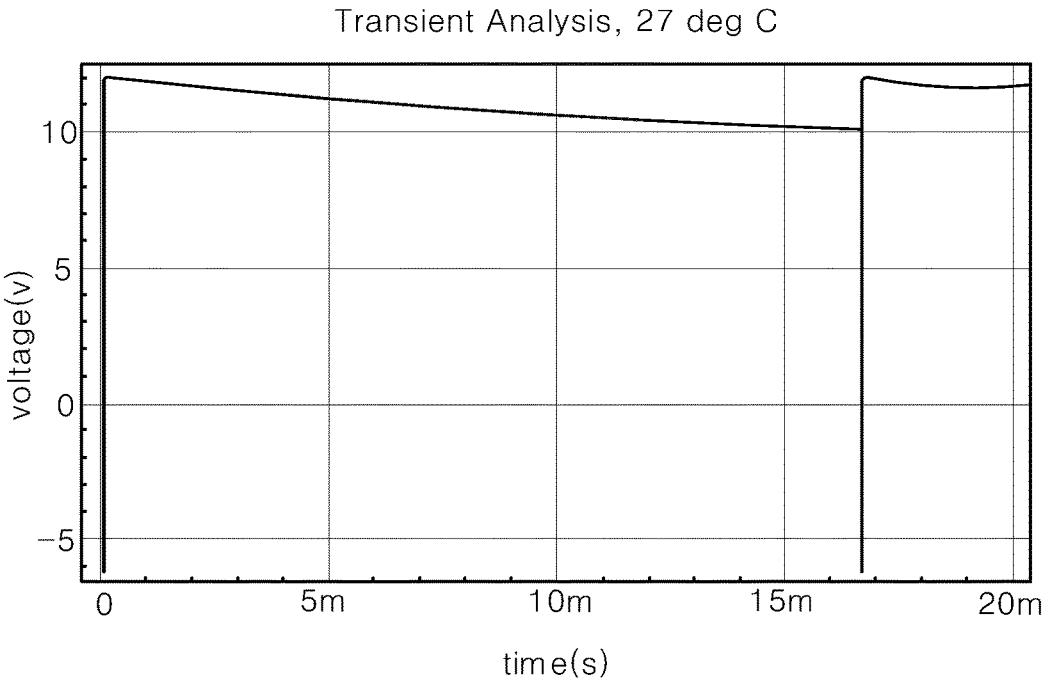
FIG. 6 (Related Art)
FIG. 6 is a graph showing the electrical properties of an output voltage of the inverter unit of the OLED display device of FIG. 1.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which are illustrated in the accompanying drawings. In the following description, when a detailed description of well-known functions or configurations related to this document is determined to unnecessarily cloud a gist of the invention, the detailed description thereof will be omitted. The progression of processing steps and/or operations described is an example; however, the sequence of steps and/or operations is not limited to that set forth herein and may be changed as is known in the art, with the exception of steps and/or operations necessarily occurring in a certain order. Like reference numerals designate like elements throughout. Names of the respective elements used in the following explanations are selected only for convenience of writing the specification and may be thus different from those used in actual products.

In the description of embodiments, when a structure is described as being positioned “on or above” or “under or below” another structure, this description should be construed as including a case in which the structures contact each other as well as a case in which a third structure is disposed therebetween.

Figure 7:
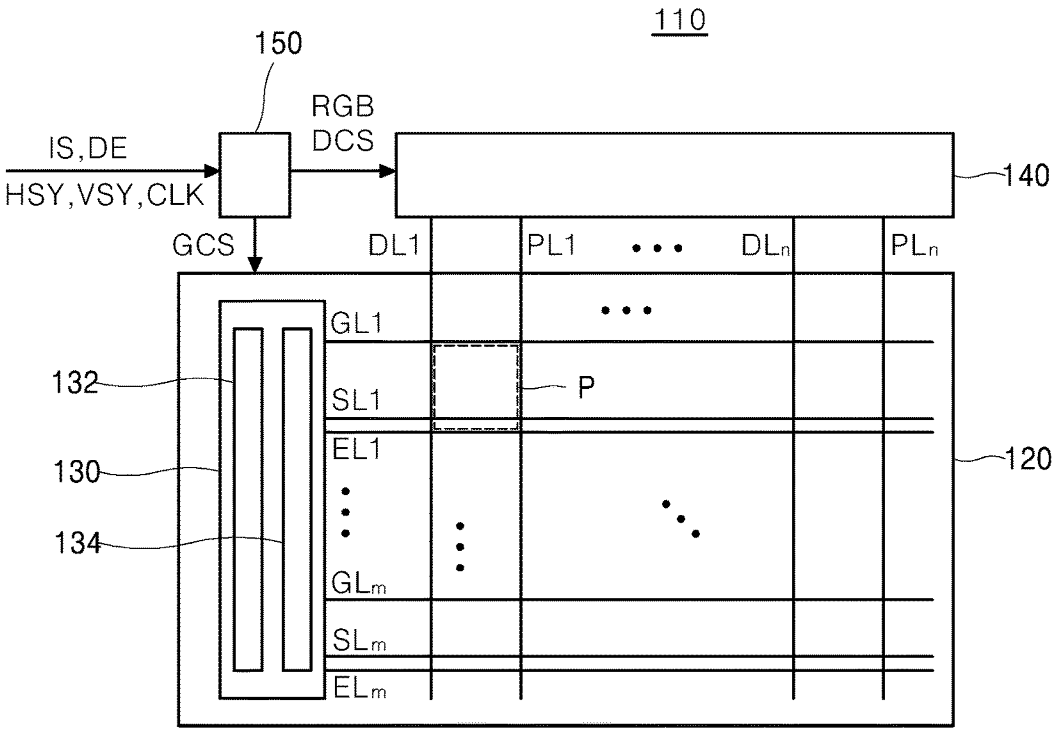
FIG. 7 illustrates an OLED display device according to an embodiment of the present disclosure.
Figure 8:
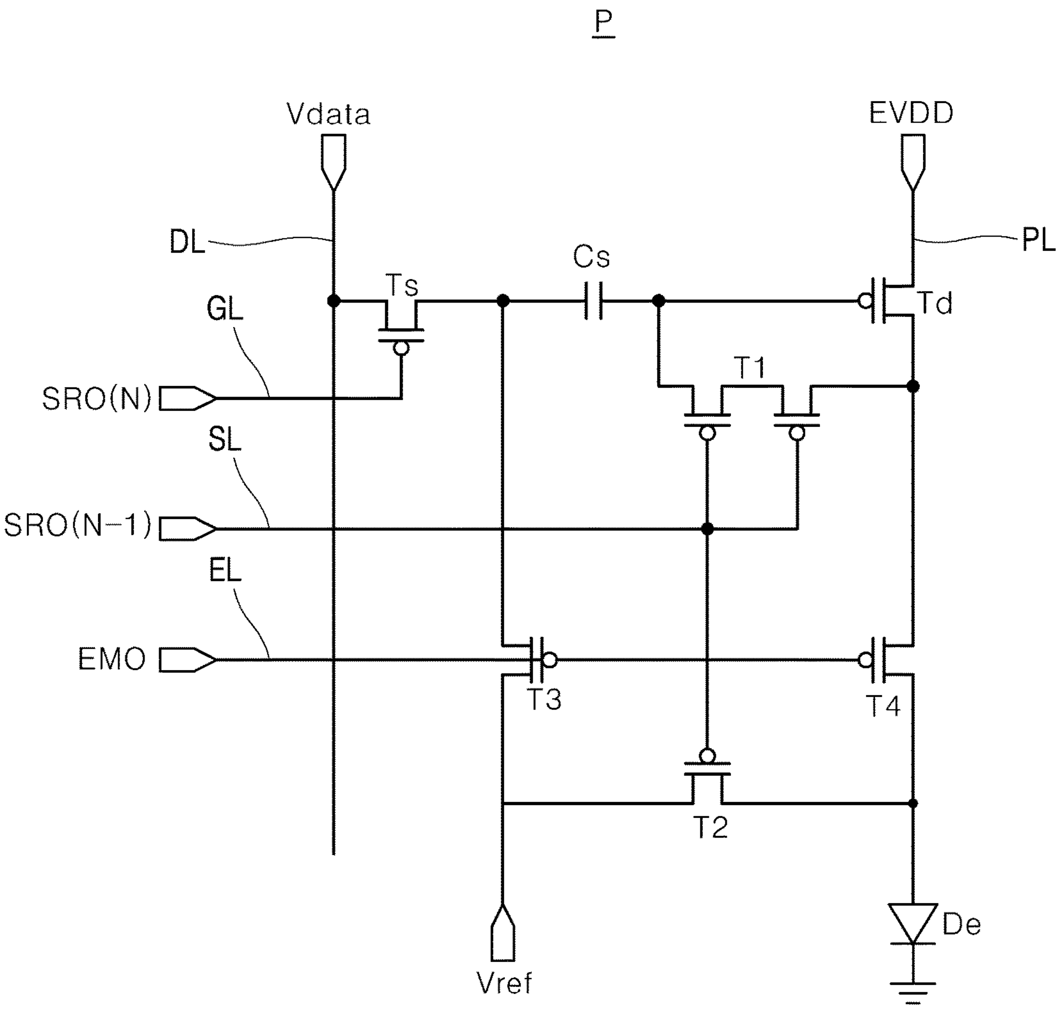
FIG. 8 is a circuit diagram of pixel areas of the OLED display device of FIG. 7.

FIG. 7 illustrates an OLED display device according to an embodiment of the present disclosure. FIG. 8 is a circuit diagram of pixel areas of the OLED display device of FIG. 7.

With reference to FIG. 7, an OLED display device 110 may include a display panel 120 for displaying an image, a gate driving unit 130 for supplying a gate signal, a data driving unit 140 for supplying a data signal, and a timing control unit 150 for supplying a gate control signal GCS, a data control signal DCS, and image data RGB.

The display panel 120 may include a plurality of gate lines GL1 to GLm, a plurality of sampling lines SL1 to SLm, a plurality of emission lines EL1 to Elm, a plurality of data lines DL1 to DLn, and a plurality of power lines PL1 to PLn, which are on a substrate. The gate lines GL1 to GLm, the sampling lines SL1 to SLm, and the emission lines EL1 to Elm cross the data lines DL1 to DLn and the power lines PL1 to PLn, defining a pixel area P.

The gate driving unit 130 may generate a gate signal by using the gate control signal GCS transmitted by the timing control unit 150, and may transmit a generated gate signal to the gate lines GL1 to GLm of the display panel 120. The gate driving unit 130 may be formed by a gate-in-panel (GIP) method in which a gate driving unit is formed on the substrate of the display panel 120. For example, a plurality of thin film transistors (TFTs) of the gate driving unit 130 may be formed through the same process with a plurality of TFTs in the pixel area P of the display panel 120.

The data driving unit 140 may generate a data signal by using the data control signal DCS and the image data RGB transmitted by the timing control unit 150, and may transmit a generated data signal to the data lines DL1 to DLn of the display panel 120. A power supply unit may supply a power voltage to the power lines PL1 to PLn via the data driving unit 140.

The timing control unit 150 may generate the gate control signal GCS, the data control signal DCS, and the image data RGB by using an image signal IS, a data enable signal DE, a horizontal sync signal HSY, a vertical sync signal VSY, and a clock signal CLK, which may be input from an external system.

With reference to FIG. 8, in the OLED display device 110 configured as above, when a switching TFT Ts is turned on in response to the gate signal applied via the gate lines GL1 to GLm, the data signal applied via the data lines DL1 to DLn may be applied to a driving TFT Td via the switching TFT Ts. Thus, the driving TFT Td may be turned on. A current applied via the power lines PL1 to PLn may be applied to a light-emitting diode De via the driving TFT Td, thereby enabling display of a grayscale level. Each pixel area P of the display panel 20 may further include a plurality of compensation elements (e.g., TFTs T1 to T4) to compensate for a change in a threshold voltage Vth of the driving TFT Td.

With further reference to FIG. 8, each pixel area P of the display panel 120 may include the switching TFT Ts, the driving TFT Td, first to fourth compensation TFTs T1 to T4, a storage capacitor Cs, and the light-emitting diode De, in which each of the switching TFT Ts, the driving TFT Td, the first to the fourth compensation TFTs T1 to T4 may be a positive type (p-type) transistor, e.g., a positive metal oxide semiconductor (PMOS). Alternatively, any of the transistors may be a negative type (n-type) transistor, e.g., a negative metal oxide semiconductor (NMOS), with appropriate logic level changes.

The gate, drain, and source of the switching TFT Ts may be respectively connected to the gate line GL, one end of the storage capacitor Cs, and the data line DL. The gate, drain, and source of the driving TFT Td may be respectively connected to the other end of the storage capacitor Cs, the source of a third compensation transistor T3, and the power line PL.

The gate, drain, and source of a first compensation TFT T1, which is a sampling TFT, may be respectively connected to the sampling line SL, the drain of the driving TFT Td, and the gate of the driving TFT Td. The first compensation TFT T1 may be a dual gate type in which two transistors are serially connected.

The gate, drain, and source of the second compensation TFT T2 may be respectively connected to the sampling line SL, a reference voltage Vref, and the drain of the fourth compensation TFT T4. The gate, drain, and source of the third compensation TFT T3 may respectively connected to the emission line EL, the reference voltage Vref, and the one end of the storage capacitor Cs. The gate, drain, and source of the fourth compensation TFT T4, which is an emission TFT, may be respectively connected to the emission line EL, the drain of the driving TFT Td, and one end of the light-emitting diode De. The other end of the light-emitting diode De may be grounded.

An $N^{th}$ register output voltage SRO(N), which is the gate signal, may be applied to the gate line GL. A data voltage Vdata, which is the data signal, may be applied to the data line DL. A power voltage EVDD may be applied to the power line PL. An $(N-1)^{th}$ register output voltage SRO(N−1), which is a sampling signal, may be applied to the sampling line SL. An emission output voltage EMO, which is an emission signal, may be applied to the emission line EL.

In the pixel area P, during a time period prior to the application of the $N^{th}$ register output voltage SRO(N), the (N−1)th register output voltage SRO(N−1) may be applied to the sampling line SL so that the first compensation TFT T1 is turned on. As a result, a changed threshold voltage Vth may be stored in the storage capacitor Cs.

Then, the $N^{th}$ register output voltage SRO(N) may be applied to the gate line GL. Thus, the switching TFT Ts may be turned on, and the data voltage Vdata may be transferred to the storage capacitor Cs. Because the driving TFT Td is turned on by a sum voltage of the data voltage Vdata and the changed threshold voltage Vth, a change of the threshold voltage of the driving TFT Td may be compensated.

With further reference to FIG. 7, to apply the gate signal, the sampling signal, and the emission signal to each pixel area P of the display panel 120, the gate driving unit 130 may include a shift register unit 132 for outputting the gate signal and the sampling signal and an inverter unit 134 for outputting the emission signal. The shift register unit 132 may input a register output voltage SRO (FIG. 8), including the gate signal, the sampling signal, and the emission signal, directly to each pixel area P. The inverter unit 134 may generate the emission signal by using the register output voltage SRO of the shift register unit 132 or an output voltage of a separate shift register unit, and may input the emission output voltage EMO (FIG. 8), e.g., the emission signal, directly to each pixel area P.

The inverter unit 134 may include an emission boosting capacitor connected to an emission Q node and electrically floated to periodically boost a voltage of the emission Q node in response to a periodically applied clock signal. A "Q node" denotes a gate node of the driving TFT Td. The emission boosting capacitor may be connected to a gate of an emission pull-up TFT, and may periodically receive a clock signal to boost the emission Q node.

Accordingly, whenever a certain clock signal is input, the emission boosting capacitor may boost the emission Q node. Accordingly, a boosted voltage may be applied to the gate of the emission pull-up TFT. As such, in the high temperature reliability environment, the voltage of the emission Q node may be maintained normally, even when a current leakage occurs in the emission pull-up TFT.

Figure 9:
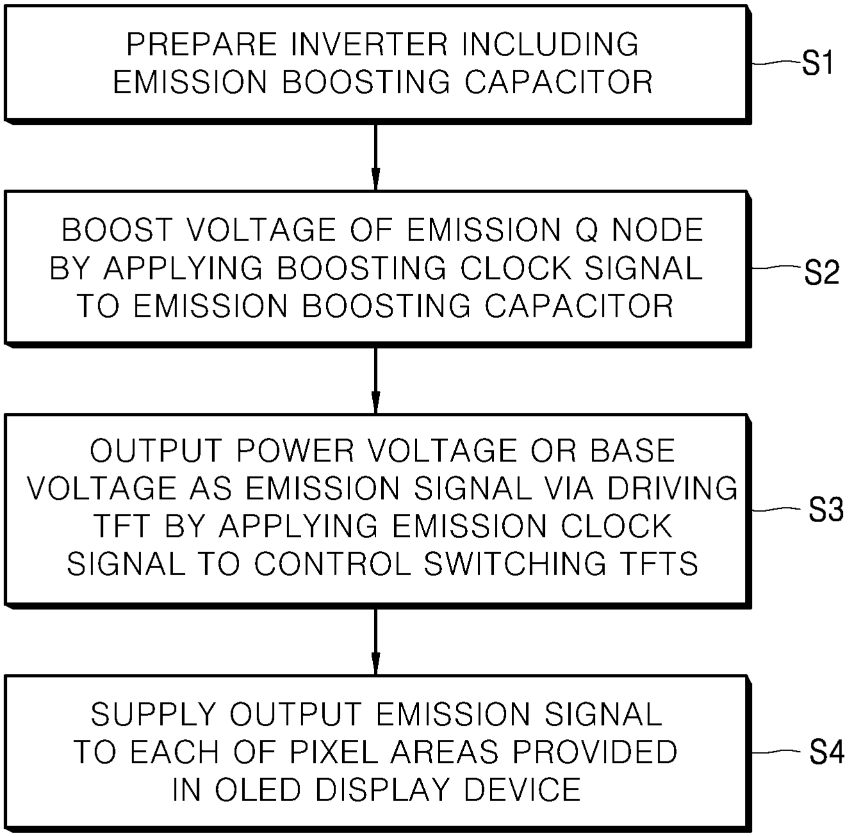
FIG. 9 is a flowchart of a method of driving an OLED display device according to an embodiment of the present disclosure.

FIG. 9 is a flowchart of a method of driving an OLED display device according to an embodiment of the present disclosure.

With reference to FIG. 9, in the method of driving an OLED display device according to an embodiment, an inverter connected to an emission Q node and electrically floated may be prepared (S1). Next, a boosting clock signal may be applied to an emission boosting capacitor to boost a voltage of the emission Q node (S2). Next, an emission clock signal may be applied to control a plurality of switching TFTs. Thus, a power voltage or a base voltage may be output as an emission signal via a driving TFT (S3). An output emission signal may be supplied to each of a plurality of pixel areas provided in the OLED display device (S4).

Figure 10:
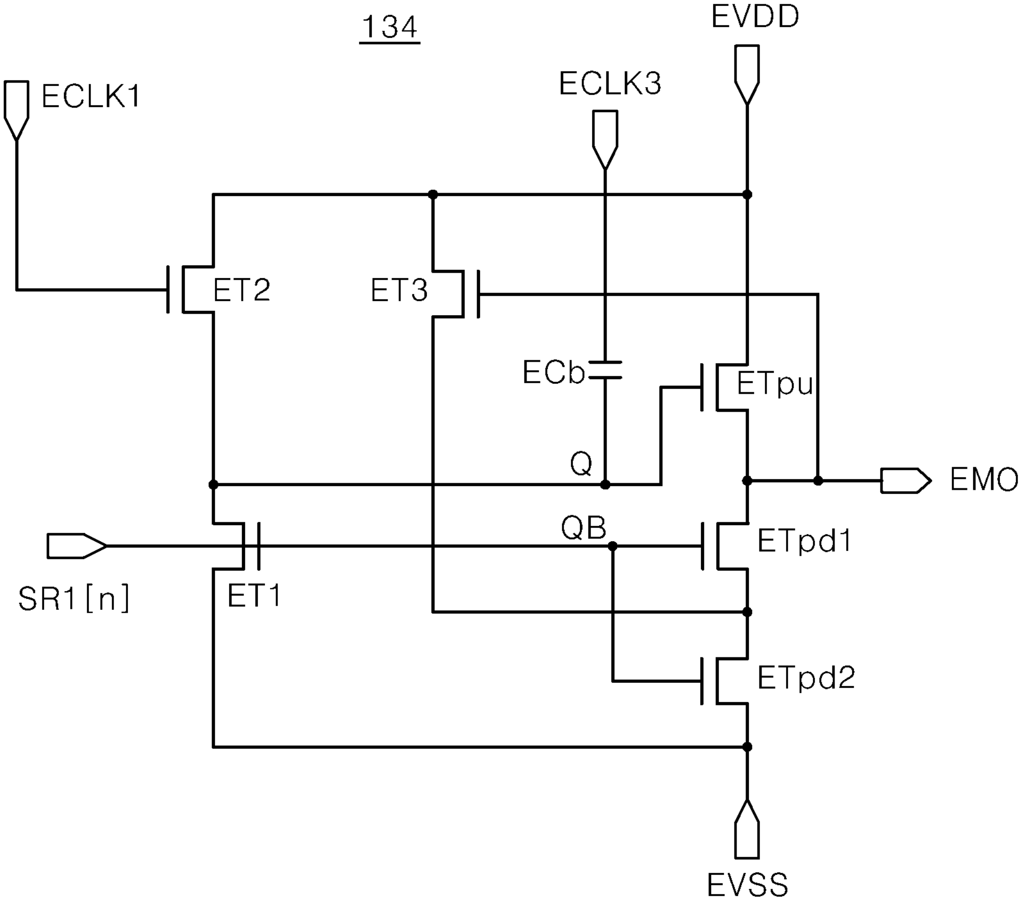
FIG. 10 is a circuit diagram of an inverter unit of the OLED display device of FIG. 7.
Figure 11:
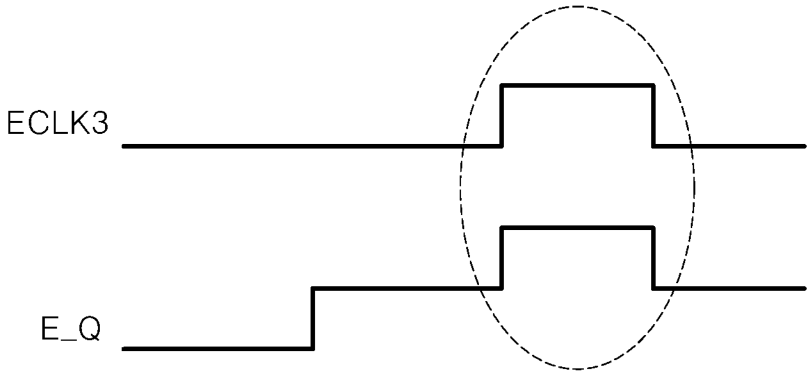
FIG. 11 is a timing diagram of a voltage of the emission Q node of the inverter unit of the OLED display device of FIG. 7.

FIG. 10 is a circuit diagram of an inverter unit of the OLED display device of FIG. 7. FIG. 11 is a timing diagram of a voltage of the emission Q node of the inverter unit of the OLED display device of FIG. 7.

With reference to FIG. 10, one stage of the inverter unit 134 corresponding to one horizontal pixel line of the display panel 120 is illustrated. The inverter unit 134 may include a plurality of stages corresponding to a plurality of horizontal pixel lines of the display panel 120. Accordingly, while a first clock signal ECLK1 may be used an emission clock signal to output an emission signal for a first stage, a second clock signal ECLK2 (see FIG. 12), a third clock signal ECLK3, and a fourth clock ECLK4 (see FIG. 12) may be used as emission clock signals for other stages.

The inverter unit 134 of the OLED display device 110 according to an embodiment may include first to third emission TFTs ET1 to ET3, an emission pull-up TFT ETpu, first and second emission pull-down TFTs ETpd1 and ETpd2, and an emission boosting capacitor ECb. The emission pull-up TFT ETpu and the first and second emission pull-down TFTs ETpd1 and ETpd2 may be driving TFTs for outputting the power voltage or base voltage as the emission signal. The first to third emission TFTs ET1 to ET3 may be switching TFTs for controlling turn-on/off of the driving TFT. The emission boosting capacitor ECb may be connected to the emission Q node, and may be electrically floated to periodically boost the voltage of the emission Q node in response to one or more periodically applied clock signals. Each of the first to third emission TFTs ET1 to ET3, the emission pull-up TFT ETpu, and the emission pull-down TFT ETpd may be a positive type (p-type) transistor (PMOS), although embodiments are not limited thereto. For example, each of the first to third emission TFTs ET1 to ET3, the emission pull-up TFT ETpu, and the emission pull-down TFT ETpd may be a negative type (n-type) transistor (NMOS), as illustrated in FIG. 10.

A gate, a drain, and a source of the emission pull-up TFT ETpu may be respectively connected to an emission Q node Q, the power voltage EVDD, and a drain of the first emission pull-down TFT ETpd1. The emission boosting capacitor ECb may be connected to the gate of the emission pull-up TFT ETpu. The emission boosting capacitor ECb may be connected to the emission Q node Q, and may be electrically floated. The third clock signal ECLK3 may be input to the emission boosting capacitor ECb.

When the first clock signal ECLK1 is input, the emission Q node Q may supply an operating power to the gate of the emission pull-up TFT ETpu to turn on the emission pull-up TFT ETpu. Accordingly, the first clock signal ECLK1 may be used as the emission clock signal.

Accordingly, with reference to FIG. 11, when the third clock signal ECLK3 is input, the emission boosting capacitor ECb may boost the emission Q node Q as shown in the waveform of E_Q. Accordingly, the third clock signal ECLK3 may be used as a boosting clock signal. The third clock signal ECLK3 may be generated by shifting the first clock signal ECLK1.

In other words, when the third clock signal ECLK3 is input to the emission boosting capacitor ECb while the emission boosting capacitor ECb maintains the operating power of the gate of the emission pull-up TFT ETpu in response to the first clock signal ECLK1, because the emission boosting capacitor ECb is in a floating state, a voltage doubling phenomenon occurs. Therefore, boosting the emission Q node Q means doubling the voltage of the emission Q node Q.

A gate and a source of the first emission pull-down TFT ETpd1 may be respectively connected to an emission QB node QB and a drain of the second emission pull-down TFT ETpd2. A gate and a source of the second emission pull-down TFT ETpd2 may be respectively connected to the emission QB node QB and a base voltage EVSS. The emission output voltage EMO of the inverter unit 134 may be output from a node between the emission pull-up TFT ETpu and the first emission pull-down TFT ETpd1.

The emission pull-up TFT ETpu and the first and second emission pull-down TFTs ETpd1 and ETpd2 are devices for determining a voltage value of the emission output voltage EMO of the inverter unit 134, and may be controlled to be tuned on/off by voltages of the emission Q node Q and the emission QB node QB having opposite high/low levels. For example, when the emission pull-up TFT ETpu is turned on and the first and second emission pull-down TFTs ETpd1 and ETpd2 are turned off, the inverter unit 134 may output the power voltage EVDD as the emission output voltage EMO. When the emission pull-up TFT ETpu is turned off and the first and second emission pull-down TFTs ETpd1 and ETpd2 are turned off, the inverter unit 134 may output the base voltage EVSS, e.g., ground or a low-level voltage, to the emission output voltage EMO.

The first emission TFT ET1 may be connected between the emission Q node Q and the base voltage EVSS, and may be controlled by a register output voltage SR1 of the shift register unit 132. The second emission TFT ET2 may be connected between the power voltage EVDD and the emission Q node Q, and may be controlled by the first clock signal ECLK1. The third emission TFT ET3 may be connected between the power voltage EVDD and the source of the first emission pull-down TFT ETpd1, and may be controlled by the emission output voltage EMO.

For example, a gate and a source of the first emission TFT ET1 may be respectively connected to a register output voltage SR1, e.g., SR1[*n*], and the base voltage EVSS. A gate, a drain, and a source of the second emission TFT ET2 may be respectively connected to the first clock signal ECLK1, the power voltage EVDD, and a drain of the first emission TFT ET1. A gate, a drain, and a source of the third emission TFT ET3 may be respectively connected to the emission output voltage EMO, the power voltage EVDD, and the source of the first emission pull-down TFT ETpd1.

Figure 12:
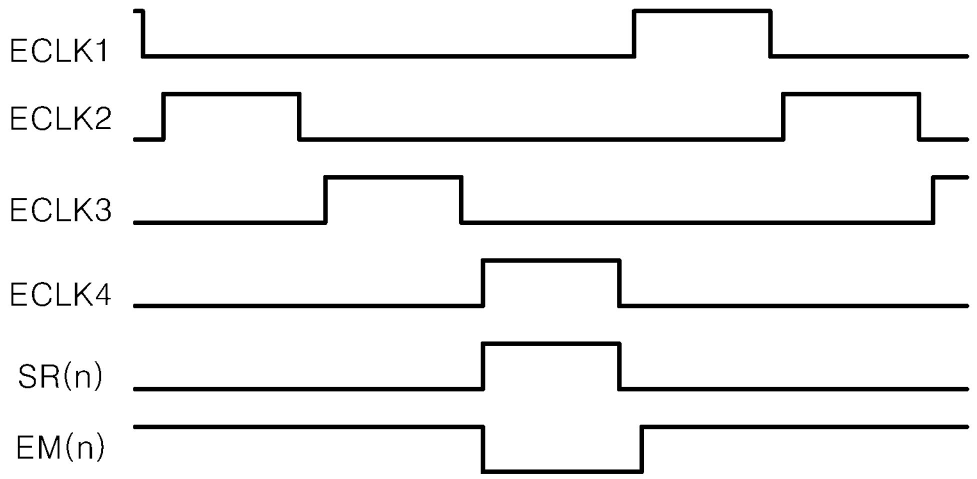
FIG. 12 is an output timing diagram of the inverter unit of the OLED display device of FIG. 7.

FIG. 12 is an output timing diagram of the inverter unit of the OLED display device of FIG. 7.

With reference to FIG. 12, the inverter unit 134 may output an emission signal EM(n) by inverting an output signal SR(n) of a shift register for generating a gate signal to sequentially turn on the switching TFTs Ts. Accordingly, the emission signal EM(n) may be output because the emission pull-up TFT ETpu may be turned on when the first clock signal ECLK1 is input.

The emission boosting capacitor ECb may be connected to the gate of the emission pull-up TFT ETpu. The third clock signal ECLK3 may be periodically input to the emission boosting capacitor ECb.

Accordingly, whenever the third clock signal ECLK3 is input, the emission boosting capacitor ECb may boost the emission Q node Q. Thus, a boosted voltage may be applied to the gate of the emission pull-up TFT ETpu. Accordingly, even when a current leakage occurs in the TFT in the high temperature reliability environment, the voltage of the emission Q node may be normally maintained.

Figure 13:
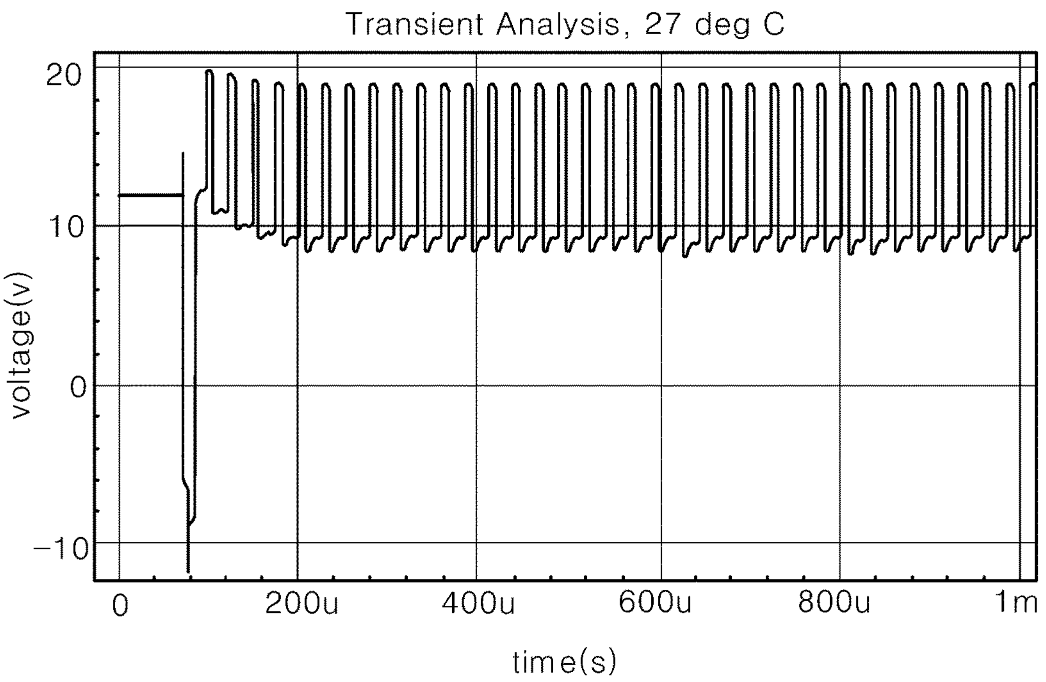
FIG. 13 is a graph showing the electrical properties of the emission Q node of the inverter unit of the OLED display device of FIG. 7.

FIG. 13 is a graph showing the electrical properties of the emission Q node of the inverter unit of the OLED display device of FIG. 7.

With reference to FIG. 13, regardless of occurrence of a current leakage in the TFT in the high temperature reliability environment, the emission Q node of the inverter unit 134 may be maintained to be 12V or higher whenever the third clock signal ECLK3 is applied. This is because the emission boosting capacitor ECb connected to the emission Q node of the inverter unit 134 and electrically floated may periodically boost the voltage of the emission Q node whenever the third clock signal ECLK3 is periodically applied. In the FIG. 13 graph, the maximum value of a voltage periodically appears whenever the third clock signal ECLK3 is applied.

Figure 14:
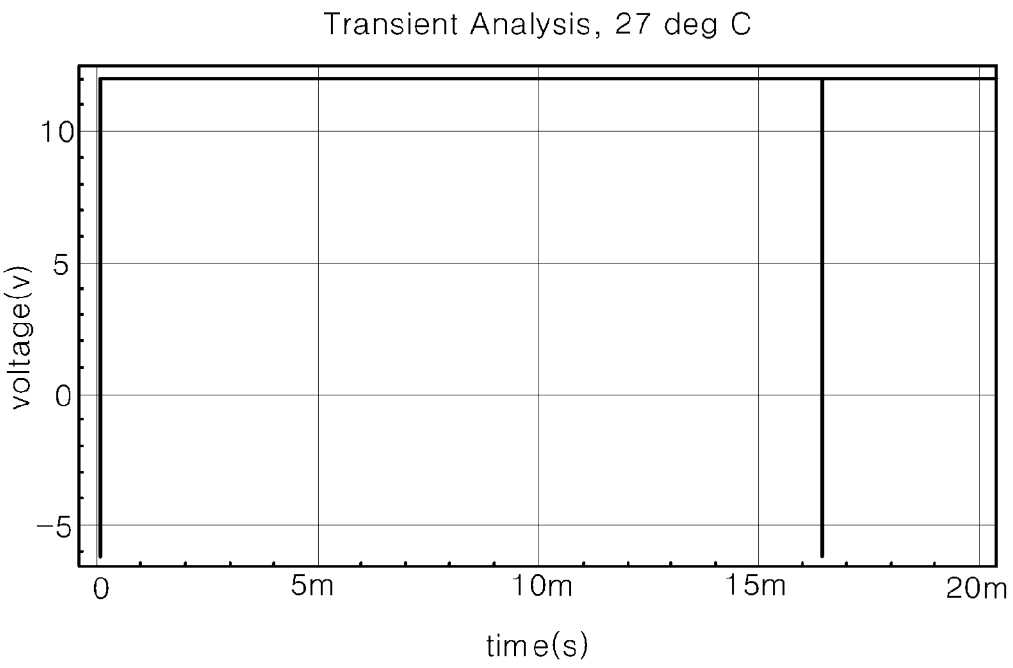
FIG. 14 is a graph showing the electrical properties of an output voltage of the inverter unit of the OLED display device of FIG. 7.

FIG. 14 is a graph showing the electrical properties of an output voltage of the inverter unit of the OLED display device of FIG. 7.

With reference to FIG. 14, as the voltage of the emission Q node of the inverter unit 134 is maintained to be 12V or higher, the emission output voltage of the inverter unit 134 may be maintained constant and no output drop is generated. As the emission boosting capacitor ECb may periodically boost the voltage of the emission Q node Q, the TFT in a high temperature environment may be degraded. Accordingly, even when a current leakage occurs, the emission output voltage of the inverter unit 134 may be stably maintained without lowering.

When the emission output voltage of the inverter unit 134 is normally maintained, a degree of turn-on of a light-emitting transistor may be normally operated. As a diode current flowing in the light-emitting diode may be normally supplied, a defect, such as an irregular horizontal pattern in which a horizontal pixel line of a display panel is irregularly darkened, may be prevented.

In the above-described examples, the inverter unit is formed at one side of the display panel. However, embodiments of the present disclosure are not limited thereto. For example, the inverter unit may be formed at both sides of the display panel. When the inverter unit is formed at one side of the display panel, as an area in a bezel occupied by the inverter unit decreases, the size of the display panel in the OLED display device having a small size may be implemented to be relatively larger. In an OLED display device using a large-sized display panel, forming the inverter unit at both sides of the display panel may more effectively reduce a load of a circuit for controlling a pixel area.

As described above, when the emission boosting capacitor connected to the gate node of the driving TFT of the gate driving unit provided in the display device is electrically floated and a clock signal is periodically applied, the voltage of the gate node of the driving TFT may be periodically boosted. As such, by periodically boosting the voltage of a gate node of the driving TFT, even when the TFT is degraded in a high temperature environment and a current leakage occurs, the emission output voltage of the gate driving unit is not lowered and may be stably maintained.

Because the emission output voltage of the inverter unit is normally maintained, a degree of turn-on of a light-emitting transistor may be normally operated. As a diode current flowing in the light-emitting diode is normally supplied, a defect such as an irregular horizontal line pattern, i.e., horizontal pixel lines of a display panel are irregularly darkened, may be prevented so that display quality is improved.

It will be apparent to those skilled in the art that various modifications and variations may be made in the present disclosure without departing from the spirit or scope of the invention. Thus, it is intended that embodiments of the present disclosure cover the modifications and variations of this invention provided they come within the scope of the appended claims and their equivalents.

What is claimed is:

1. A display device, comprising:
- a display panel comprising a plurality of pixel areas;
- a gate driver configured to supply an emission signal to each of the plurality of pixel areas through switching of a driving TFT by inverting an input signal, the gate driver comprising:
  - an emission boosting capacitor configured to periodically boost a voltage applied to a gate node of the driving TFT, the emission boosting capacitor being directly connected at one end to an emission Q node and at another end to a boosting clock signal input to receive a boosting clock signal;
  - an emission pull-up TFT comprising:
    - a gate connected to the emission Q node;
    - a drain connected to a power voltage; and
    - a source connected to an emission signal output;
- a data driver configured to supply a data signal to each of the plurality of pixel areas; and
- a timing controller configured to:
  - supply a gate control signal to the gate driver; and
  - supply a data control signal and image data to the data driver.

2. The display device of claim 1, wherein the gate driver further comprises:
- a first emission pull-down TFT comprising a drain connected to a source of the emission pull-up TFT;
- a second emission pull-down TFT comprising:
  - a gate connected to a QB node;
  - a drain connected to a source of the first emission pull-down TFT; and
  - a source connected to a base voltage;
- a first emission TFT comprising:
  - a gate connected to a register output voltage; and
  - a source connected to the base voltage;
- a second emission TFT comprising:
  - a gate connected to an emission clock signal;
  - a drain connected to the power voltage; and
  - a source connected to a drain of the first emission TFT; and
- a third emission TFT comprising:
  - a gate connected to an emission output voltage;
  - a drain connected to the power voltage; and
  - a source connected to a source of the first emission pull-down TFT.

3. The display device of claim 2, wherein, when the emission clock signal is input, the second emission TFT supplies an operating power to a gate of the emission pull-up TFT to turn the emission pull-up TFT on.

4. The display device of claim 3, wherein, when the operating power of the gate of the emission pull-up TFT is maintained by the emission clock signal and the boosting clock signal is input, the emission boosting capacitor boosts the output of the second emission TFT.

5. The display device of claim 2, wherein each of the first to third emission TFTs, the emission pull-up TFT, and the emission pull-down TFT is a p-type TFT.

6. The display device of claim 1, wherein the gate driver comprises a plurality of stages corresponding to a plurality of horizontal pixel lines of the display panel.

7. The display device of claim 1, wherein the gate driver is at one side of the display panel.

8. The display device of claim 1, wherein the gate driver is at both sides of the display panel.

9. A gate driving circuit for supplying an emission signal to each of a plurality of pixel areas provided in a display device, the gate driving circuit comprising:
- a driving TFT configured to output a power voltage or a base voltage as the emission signal to each of the plurality of pixel areas by inverting an input signal;
- a plurality of switching TFTs configured to control turn-on or turn-off of the driving TFT;
- an emission boosting capacitor configured to periodically boost a voltage applied to a gate node of the driving TFT, the emission boosting capacitor being directly connected at one end to an emission Q node and at another end to a boosting clock signal input to receive a boosting clock signal;
- an emission pull-up TFT comprising:
  - a gate connected to the emission Q node;
  - a drain connected to a power voltage; and
  - a source connected to an emission signal output.

10. The gate driving circuit of claim 9, further comprising:
- a first emission pull-down TFT comprising a drain connected to a source of the emission pull-up TFT; and
- a second emission pull-down TFT comprising:
  - a gate connected to a QB node;
  - a drain connected to a source of the first emission pull-down TFT; and
  - a source connected to a base voltage;
- wherein the plurality of TFTs comprise:
- a first emission TFT comprising:
  - a gate connected to a register output voltage, and
  - a source connected to the base voltage,
- a second emission TFT comprising:
  - a gate connected to a clock signal to output the emission signal,
  - a drain connected to the power voltage, and
  - a source respectively connected to a drain of the first emission TFT, and
- a third emission TFT comprising:
  - a gate connected to an emission output voltage,
  - a drain connected to the power voltage, and
  - a source connected to a source of the first emission pull-down TFT.

11. The gate driving circuit of claim 10, wherein, when the emission clock signal is input, the second emission TFT is configured to supply an operating power to a gate of the emission pull-up TFT to turn the emission pull-up TFT on.

12. The gate driving circuit of claim 11, wherein, when the operating power of the gate of the emission pull-up TFT is maintained by the emission clock signal and boosting clock signal is input, the emission boosting capacitor is configured to boost the output of the second emission TFT.

13. A method of driving a display device comprising a gate driving circuit connected to a gate node of a driving TFT, the gate driving circuit comprising an emission boosting capacitor that is electrically floated, the method comprising:

boosting a voltage of a gate node of the driving TFT by applying a boosting clock signal to the emission boosting capacitor, the emission boosting capacitor being directly connected at one end to an emission Q node and at another end to a boosting clock signal input to receive the boosting clock signal;

outputting a power voltage or a base voltage as an emission signal through the driving TFT by controlling a plurality of switching TFTs by applying an emission clock signal; and supplying an output emission signal to each of a plurality of pixel areas provided in the display device, wherein the gate driving circuit further comprises an emission pull-up TFT comprising:

a gate connected to the emission Q node, a drain connected to a power voltage, and a source connected to an emission signal output.

* * * * *